United States Patent [19]
Abbott et al.

[11] Patent Number: 5,672,915
[45] Date of Patent: Sep. 30, 1997

[54] CERAMIC COATED PLASTIC PACKAGE

[75] Inventors: Donald C. Abbott, Norton, Mass.; Raymond A. Frechette, N. Providence, R.I.

[73] Assignee: Texas Instruments Incorporated, Dallas, Tex.

[21] Appl. No.: 658,292

[22] Filed: Jun. 5, 1996

Related U.S. Application Data

[63] Continuation of Ser. No. 431,388, Apr. 28, 1995, abandoned, which is a continuation of Ser. No. 198,073, Jan. 29, 1994, abandoned, which is a division of Ser. No. 771,720, Oct. 4, 1991, Pat. No. 5,302,553.

[51] Int. Cl.$^6$ ................................................ H01L 23/29
[52] U.S. Cl. ........................ 257/790; 257/787; 257/687
[58] Field of Search ........................... 257/790, 787, 257/687

[56] References Cited

U.S. PATENT DOCUMENTS

| | | | |
|---|---|---|---|
| 3,831,265 | 8/1974 | Louzon et al. | 257/790 |
| 4,117,508 | 9/1978 | Koenig | 257/687 |
| 4,477,828 | 10/1984 | Scherer | 257/790 |
| 4,887,148 | 12/1989 | Mu | 257/687 |
| 5,140,384 | 8/1992 | Tanaka | 257/790 |

FOREIGN PATENT DOCUMENTS

| | | | |
|---|---|---|---|
| 122687 | 10/1984 | European Pat. Off. | 257/790 |
| 321083 | 6/1989 | European Pat. Off. | 257/790 |
| 59-213147 | 12/1984 | Japan | 257/687 |
| 62-018740 | 1/1987 | Japan | 257/790 |

*Primary Examiner*—Mahshid D. Saadat
*Assistant Examiner*—T. M. Arroyo
*Attorney, Agent, or Firm*—Stanton C. Braden; W. James Brady, III; Richard L. Donaldson

[57] ABSTRACT

The invention is to a semiconductor package and the method of making the package. A moisture resistant coating such as a ceramic material is applied over a plastic packaged semiconductor device to seal the package from moisture.

6 Claims, 1 Drawing Sheet

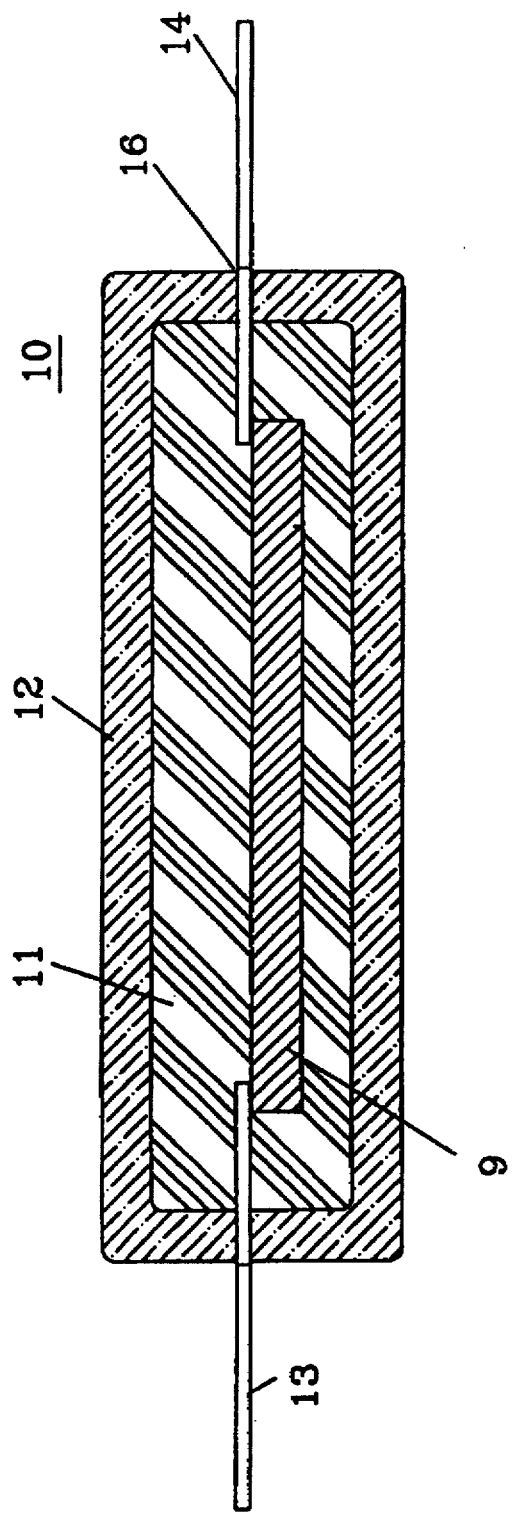
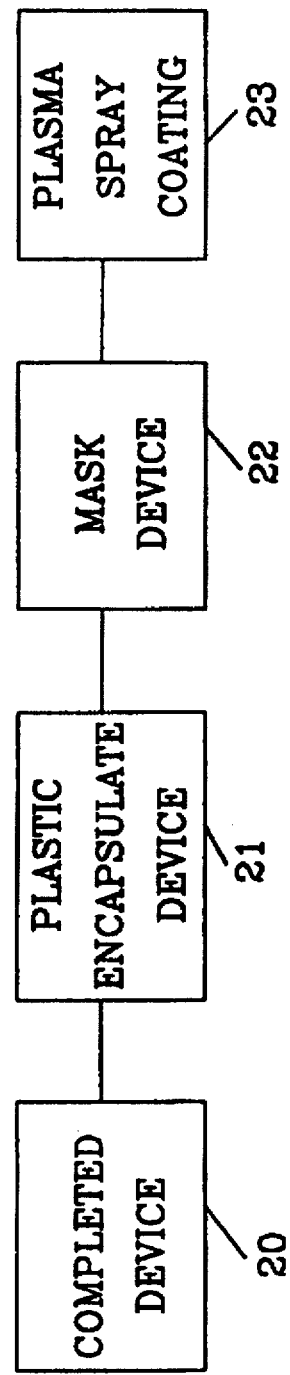
FIGURE 1
FIGURE 2

CERAMIC COATED PLASTIC PACKAGE

This application is a continuation of application Ser. No. 08/431,388, filed Apr. 28, 1995, now abandoned, which is a continuation of application Ser. No. 08/198,073, filed Jan. 29, 1994, now abandoned which is a divisional of prior application Ser. No. 07/771,720, filed Oct. 4, 1991, now U.S. Pat. No. 5,302,553.

FIELD OF THE INVENTION

This invention relates to semiconductor devices and more particularly to a plastic packaged semiconductor device having a ceramic coating over the plastic package.

BACKGROUND OF THE INVENTION

Plastic packaged semiconductor devices have an cost advantage over hermetic, ceramic packaged semiconductors. The plastic in plastic packages have the disadvantage that moisture absorbed into the package can lead to reliability failures. Failures result from corrosion on one or more of the following components the silicon chip, the gold wire connections which are connected to the silicon chip, and on the supporting structure such as the lead frame. As miniaturization components continues, the trend is for thinner and thinner plastic packages. This increases the possibility of moisture absorption into the plastic package.

BRIEF DESCRIPTION OF THE INVENTION

The invention is to a semiconductor package and to the method of making the package. A ceramic coating is applied over a finished plastic packaged semiconductor device. A ceramic coating is applied using a plasma torch that has a powder feeder. The device is masked to prevent the deposition of the coating on leads used for electrical connections to the device.

After a semiconductor device has been plastic encapsulated, the device is masked to cover parts that are not to be ceramic coated. The ceramic coating is applied by plasma spraying the ceramic material, which may be, for example, alumina.

The ceramic coating provides a coating impervious to moisture, reduces the ingress of moisture along metal leads that protrude from the overmolded plastic by allowing the ceramic coating to coat a small section of the lead next to the plastic to seal this area from moisture. The heat transfer characteristics of the package are improved due to the thermal conductivity of the coating and its intimate contact with the plastic. The ceramic coating provides an improved definition of the solder edge that forms when a device is mounted on a substrate by virtue of the ceramic coating serving as a stop or dam to prevent solder from flowing up the plastic.

The technical advance represented by the invention as well as the objects thereof will become apparent from the following description of a preferred embodiment of the invention when considered in conjunction with the accompanying drawings, and the novel features set forth in the appended claims.

BRIEF DESCRIPTION OF THE DRAWINGS

FIG. 1 illustrates a cross-sectional view of a ceramic coated plastic package;

FIG. 2 is a flow diagram of the method steps of the invention flow.

DESCRIPTION OF A PREFERRED EMBODIMENT

The invention is to a plastic encapsulated semiconductor device having a ceramic coating over the plastic encapsulant and to the method of applying the coating. FIG. 1 is a cross-sectional view of a device according to the present invention and illustrates one aspect of the invention. Semiconductor device 10 includes a semiconductor chip 9 having a plurality of leads attached thereto, represented by leads 13 and 14. Semiconductor chip 9 and a part of leads 13 and 14 are encapsulated in a plastic material 11. A coating of a ceramic material 12 encapsulates the plastic coating and a part of leads 13 and 14. The ceramic material extends along each lead as illustrated at numeral 16. The ceramic material provides a moisture barrier, and the ceramic coating on a part of the leads adjacent prevents moisture from entering the package at the lead-plastic interface. The device in FIG. 1 is only illustrative of the invention and is not drawn to scale. The ceramic coating in practice would be very thin.

FIG. 2 illustrates the basic steps in making the semiconductor device, encapsulant it and providing the ceramic coating.

A completed, wired semiconductor chip (20) is encapsulated (21) to provide a finished device. The leads of the plastic encapsulated device are then masked (22) to cover the parts that are to be used to make electrical connection to a socket or circuit board. A coating of ceramic such as alumina is then plasma sprayed (23) onto the masked device.

The coating is accomplished using a plasma torch and a powder feed. The powdered ceramic material is sprayed onto the device with the plasma torch. Since the device is masked to protect the connection portions of the leads, the ceramic coating is applied only to the plastic body and a small part of the leads adjacent to the device body.

What is claimed:

1. A mixed composition package for a semiconductor device, comprising:
   a semiconductor device comprising a body and at least one lead extending from said body;
   a plastic layer surrounding the semiconductor body so as to fully encase said semiconductor body in a unitary, integrally formed seamless plastic package, said lead extending through said plastic package such that said plastic layer overlies a portion of said lead, whereas a remaining portion of said lead extends outside of said plastic package; and
   a jacket comprising a layer of a ceramic material which overlies said plastic package so as to completely encase said plastic package and a segment of said remaining lead portion extending beyond said plastic package.

2. The device package according to claim 1, wherein said ceramic material is alumina.

3. The device package according to claim 1, wherein said jacket is configured as a unitary, integrally formed seamless sheath that is applied in overlying relation to an entire outer surface portion of said plastic layer.

4. A mixed composition package for a semiconductor device, comprising:

a semiconductor device comprising a body and a plurality of electrically conductive leads extending from said body;

a seamless, unitary plastic layer overlying said semiconductor device body so as to fully encapsulate the body in plastic; and a jacket formed as a seamless unitary ceramic layer, said jacket defining a cavity within which is received said plastic encapsulated semiconductor body, whereby each of said plurality of leads is comprised of a first lead portion while extends from said semiconductor body through said plastic layer to said jacket, a second lead portion that extends from said first lead portion through said jacket, and a third lead portion that extends from said second lead portion and beyond said jacket.

5. The device package according to claim 4, wherein said ceramic jacket is superposed over said second lead portion to establish a moisture seal at said second lead portion.

6. The device package according to claim 5, wherein said moisture seal extends along a portion of said lead outside of said jacket.

* * * * *